(12) United States Patent
Kim

(10) Patent No.: US 7,868,364 B2
(45) Date of Patent: Jan. 11, 2011

(54) IMAGE SENSOR

(75) Inventor: Young Sik Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/487,416

(22) Filed: Jun. 18, 2009

(65) Prior Publication Data

US 2009/0256179 A1   Oct. 15, 2009

Related U.S. Application Data

(63) Continuation of application No. 11/615,632, filed on Dec. 22, 2006, now Pat. No. 7,563,637.

(30) Foreign Application Priority Data

Dec. 28, 2005   (KR) .................... 10-2005-0131503

(51) Int. Cl.
*H01L 31/062* (2006.01)
(52) U.S. Cl. .................. 257/290; 257/292; 257/293; 257/E27.133
(58) Field of Classification Search .............. 257/290, 257/292, 293, E27.133
See application file for complete search history.

(56) References Cited

U.S. PATENT DOCUMENTS

| 6,963,092 | B2 | 11/2005 | Lee |
| 2004/0132262 | A1 | 7/2004 | Ayabe et al. |
| 2004/0140564 | A1 | 7/2004 | Lee et al. |
| 2006/0157761 | A1* | 7/2006 | Park et al. .................. 257/293 |

FOREIGN PATENT DOCUMENTS

| KR | 10-2004-0065963 | 7/2004 |
| KR | 10-2005-0106930 | 11/2005 |

* cited by examiner

*Primary Examiner*—Trung Dang
(74) *Attorney, Agent, or Firm*—Sherr & Vaughn, PLLC

(57) ABSTRACT

Embodiments relate to and image sensor. In embodiments, the image sensor may include a semiconductor substrate, a photodiode region, a gate electrode, a dummy gate, and an interlayer dielectric layer. The semiconductor substrate includes a field oxide layer. The photodiode region may be formed on the semiconductor substrate. The gate electrode may be formed on the semiconductor substrate. The dummy gate may be formed on the field oxide layer. The interlayer dielectric layer may be formed on one side of the dummy gate and includes an opening exposing the photodiode region.

13 Claims, 2 Drawing Sheets ific sensor may be a semiconductor sensor that may

IMAGE SENSOR

The present application is a continuation application of U.S. patent application Ser. No. 11/615,632 (filed on Dec. 22, 2006) now U.S. Pat. No. 7,563,637 which claims priority under 35 U.S.C. 119 and 35 U.S.C. 365 to Korean Patent Application No. 10-2005-0131503 (filed on Dec. 28, 2005), which is hereby incorporated by reference in its entirety.

BACKGROUND

An image sensor may be a semiconductor sensor that may transform an optical image to an electrical signal. The image sensor may include an optical sensor part, that may sense light, and a logic circuit part, that may transform sensed light into the electrical signal. The sensed image may thus be transformed into data.

A complementary metal oxide semiconductor (CMOS) image sensor may use a switching method. The switching method may sequentially detect an output using MOS transistors. There may be as many MOS transistors as there are pixels using CMOS technology.

A unit pixel of a CMOS image sensor may include a photodiode as a photo detector and four transistors. The four transistors may include a transfer transistor for transferring a photo-charge focused on the photodiode to a floating node, a reset transistor for resetting the floating node by removing the charge stored in the floating node, a drive transistor for operating as a source follower buffer amplifier, and a selection transistor for performing switching and addressing.

FIG. 1. illustrates a related art image sensor.

Referring to FIG. 1, a field oxide layer 120 may be formed on semiconductor substrate 100, including P– epi layer 110. An NMOS transistor, which may include gate dielectric layer 130, gate 140, and an N+ junction region (not shown), may be formed at one side of substrate 100. A photodiode, for example having a PNP structure with deep N– region 151 as photo detector, P0 region 152, and epi layer 110, may be formed at the other side of substrate 100 adjacent to gate 140. Gate 140 may be a transfer gate.

Interlayer dielectric layer 160 may be formed on substrate 100 and may surround a side portion of gate 140. Interlayer dielectric layer 160 may include first oxide layer 161, second oxide layer 162, and nitride layer 163 that may be sequentially stacked. The photodiode may be exposed by forming an opening 160a in interlayer dielectric layer 160. First oxide layer 161 may be formed of a silicon oxide ($SiO_2$). Second oxide layer 162 may be formed of a TEOS layer. Nitride layer 163 may be formed of a silicon nitride ($Si_xN_y$).

However, in the related art image sensor, a part of light incident on the photodiode through micro lens 170 and a color filter may be out of the photodiode because of a high refractive index. Therefore, an electron-hole pair generation may be reduced and a performance of the image sensor may be degraded.

SUMMARY

Embodiments relate to a method of manufacturing a semiconductor device.

Embodiments relate to an image sensor that may increase light collection efficiency of a photo detector (such as a photodiode) and may reduce performance deterioration of the photo detector, and a method of manufacturing such an image sensor.

In embodiments, an image sensor may include a semiconductor substrate including a field oxide layer, a photodiode region formed on the semiconductor substrate, a gate electrode formed on the semiconductor substrate, a dummy gate formed on the field oxide layer, and an interlayer dielectric layer formed on one side of the dummy gate, including an opening exposing the photodiode region.

In embodiments, a method of manufacturing an image sensor may include forming a field oxide layer on a semiconductor substrate, forming a gate dielectric layer and a gate material layer on the substrate, sequentially, forming a gate electrode on the semiconductor substrate and a dummy gate on the field oxide layer by patterning the gate material layer, forming a photodiode region by implanting impurity ions into the substrate, forming an interlayer dielectric layer on the substrate, and forming a predetermined opening by patterning the interlayer dielectric layer.

DETAILED DESCRIPTION OF EMBODIMENTS

Figure 1:
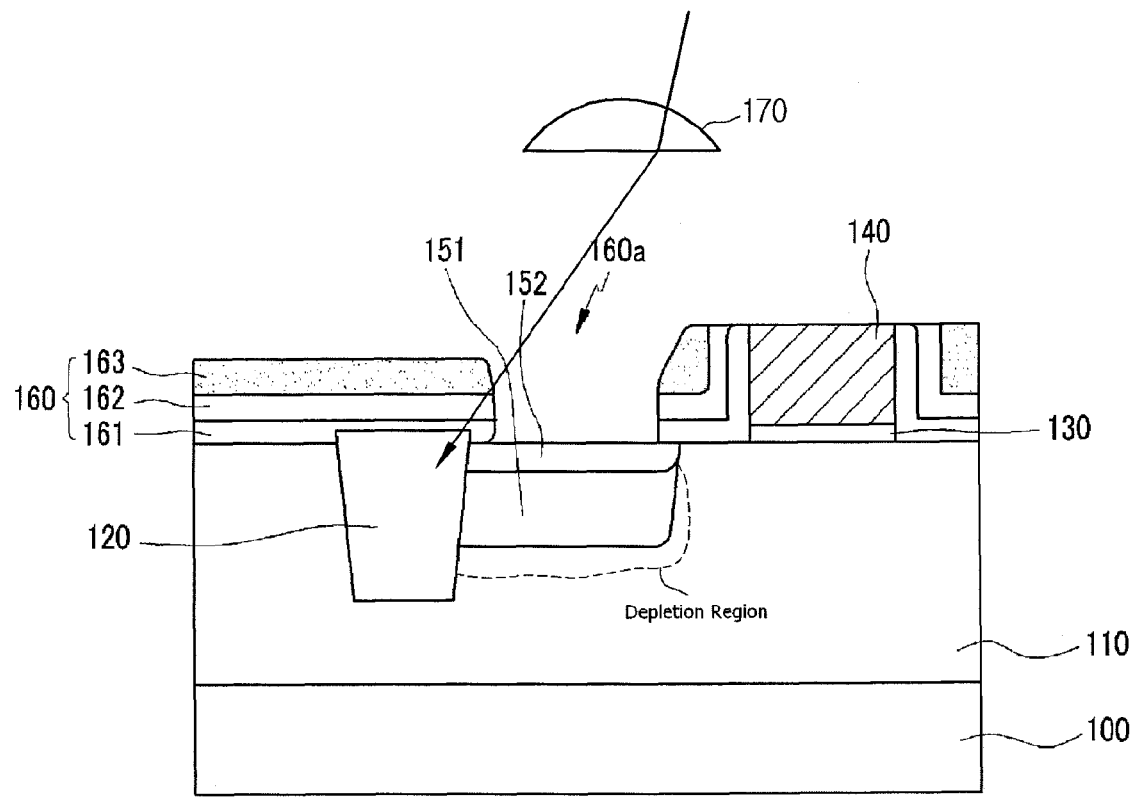
FIG. 1 is an example cross sectional view illustrating a related art image sensor.
Figure 2A:
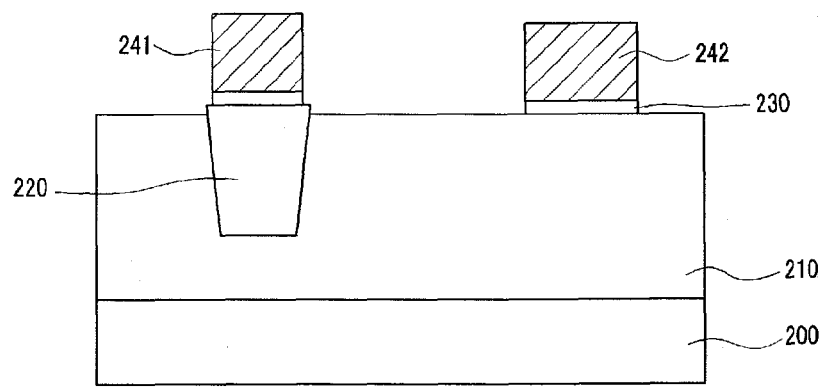
FIGS. 2A through 2C are example cross sectional views illustrating an image sensor and a method of manufacturing an image sensor according to embodiments.

Referring to FIG. 2A, field oxide layer 220 may be formed on semiconductor substrate 200, including P– epi layer 210. Gate dielectric layer 230 and a gate material layer may be subsequently deposited on substrate 200.

The gate material layer may be formed using polysilicon.

Gate electrode 242 may be formed at a side of substrate 200 and dummy gate 241 may be simultaneously formed on field oxide layer 220, for example by patterning the polysilicon. When patterning the polysilicon, gate dielectric layer 230 may also be patterned. Gate electrode 242 may be a transfer gate for a conductive line.

In embodiments, the patterning of gate dielectric layer 230 and the polysilicon may be performed to form dummy gate 241 as well as gate electrode 242. Dummy gate 241, which may be formed on field oxide layer 220, may be similar to gate electrode 242 in shape.

Figure 2B:
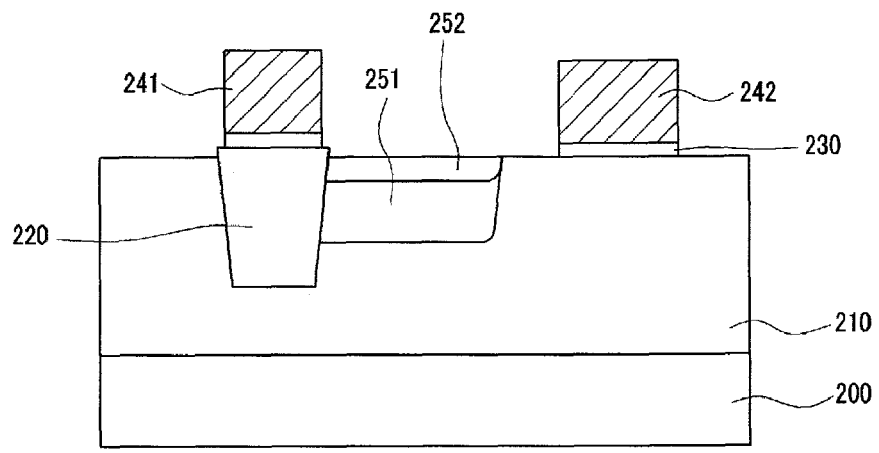

Referring to FIG. 2B, by implanting impurity ions into substrate 200, N-type impurity region 251 of deep N– region and a P-type impurity region 252 may be formed in substrate 200 adjacent to gate electrode 242, respectively.

As a result, a photodiode region may be formed, and may include N-type impurity region 251 and P-type impurity region 252.

In embodiments, when light is provided to the photodiode region, a depletion region supplying electrons may be formed around P-type impurity region 252.

In embodiments, a transistor may be formed by forming an N+ junction region (not shown) on one side of substrate 200.

Figure 2C:
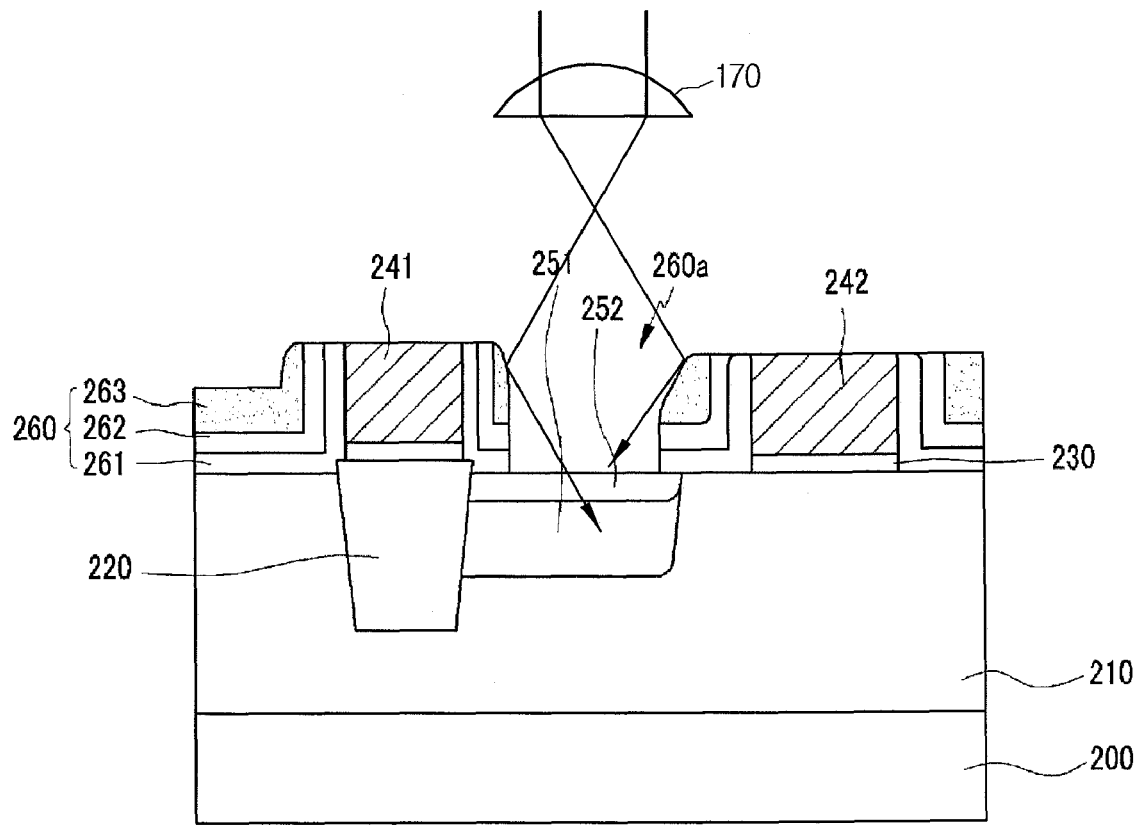

Referring to FIG. 2C, interlayer dielectric layer 260 may be formed on substrate 200. In embodiments, interlayer dielectric layer 260 may be formed on a front side of substrate 200. Interlayer dielectric layer 260 may include first oxide layer 261, second oxide layer 262, and nitride layer 263 that may be sequentially deposited.

First oxide layer 261 may be formed of a silicon oxide ($SiO_2$). Second oxide layer 262 may be formed of a TEOS layer. Nitride layer 263 may be formed of a silicon nitride ($Si_xN_y$).

Sides of dummy gate 241 and gate electrode 242 may be surrounded by interlayer dielectric layer 260, for example by patterning interlayer dielectric layer 260. In embodiments, an etching process may also be performed to remove portions of interlayer dielectric layer 260 formed on dummy gate 241 and gate electrode 242.

Hence, by patterning interlayer dielectric layer 260, interlayer dielectric layer 260 that may have been formed on both dummy gate 241 and gate electrode 242 may be removed, and interlayer dielectric layer 260 may be left to remain at sides of dummy gate 241 and gate electrode 242, respectively.

Opening 260A, which may expose the photodiode having a PNP structure, may be formed.

An area of nitride layer 263 that may have been deposited on a sidewall of opening 260A may be increased by dummy gate 241 formed on field oxide layer 220.

A part of light incident to the photodiode through micro lens 270 and a color filter (not shown) may not be over the photodiode because of a high refractive index. However, as the area of nitride layer 263 deposited on the sidewall of opening 260A is made larger, more light may be reflected from nitride oxide layer 263. As a result, the amount of the light incident on the photodiode may be increased. Hence, more light may be received by the photodiode.

Without the increased nitride oxide layer 263, part of the light refracted by micro lens 270 may be beyond the photodiode. However, according to embodiments, the part of the light that would have been beyond photodiode may be reflected on nitride oxide layer 263 and guided toward the photodiode.

Though not illustrated in FIG. 2C, a plurality of contact plugs may be formed in interlayer dielectric layer 260 formed between substrate 200 and micro lens 270. The contact plugs may provide an electrical connection between layers.

According to embodiments, light refracted by micro lens 270 may be collected into the photodiode. An electron-hole pair generation may not be reduced in the photodiode.

According to embodiments, by forming the dummy gate on the field oxide layer, an image sensor may increase light collection efficiency of a photo detector such as a photodiode. This may enhance a performance of the photo detector.

According to embodiments, during manufacturing, the dummy gate may also be formed on the field oxide layer when the gate electrode is formed. Therefore, a process cost may not be increased because a separate process to form an additional dummy gate may not be needed.

It will be apparent to those skilled in the art that various modifications and variations may be made to embodiments. Thus, it is intended that embodiments cover modifications and variations thereof within the scope of the appended claims. It is also understood that when a layer is referred to as being "on" or "over" another layer or substrate, it may be directly on the other layer or substrate, or intervening layers may also be present.

What is claimed is:

1. An image sensor comprising:
a semiconductor substrate having a field oxide layer;
a gate electrode formed over the semiconductor substrate;
a dummy gate formed over the field oxide layer;
a photodiode region formed over the semiconductor substrate between the gate electrode and the dummy gate;
an interlayer dielectric layer formed on at least one side of the dummy gate; and
an opening between the gate electrode and the dummy gate exposing a portion of the photodiode region.

2. The device of claim 1, wherein the interlayer dielectric layer is removed at the opening formed between the dummy gate and the gate electrode.

3. The device of claim 1, further comprising a gate dielectric layer formed between the dummy gate and the field oxide layer.

4. The device of claim 1, further comprising a gate dielectric layer formed on at least one side of the gate electrode.

5. An image sensor comprising:
a semiconductor substrate having a field oxide layer;
a gate electrode formed over the semiconductor substrate;
a dummy gate formed over the field oxide layer;
a photodiode region formed over the semiconductor substrate between the gate electrode and the dummy gate; and
an interlayer dielectric layer formed on at least one side of the dummy gate, wherein the interlayer dielectric layer comprises an oxide layer and a nitride layer that are sequentially stacked.

6. The device of claim 5, wherein the oxide layer and the nitride layer are formed at both sides of the dummy gate and both sides of the gate electrode.

7. The device of claim 1, wherein the dummy gate and the gate electrode are formed of the same material.

8. The device of claim 1, wherein the photodiode region comprises a P-type impurity region and an N-type impurity region.

9. The device of claim 1, wherein a surface of the interlayer dielectric layer formed at an upper portion of the at least one side of the dummy gate comprises a nitride layer.

10. The device of claim 9, wherein the nitride layer is configured to reflect light.

11. A device comprising:
a semiconductor substrate including a field oxide layer and a photodiode region adjacent to the field oxide layer;
a dummy gate formed over the field oxide layer;
a gate electrode formed on the semiconductor substrate on an opposite side of the photodiode region than the dummy gate; and
a nitride layer formed on at least a side of each of the dummy gate and the gate electrode facing the photodiode region.

12. The device of claim 11, further comprising forming a silicon oxide layer over sides of the dummy gate and the gate electrode, forming a TEOS layer over the silicon oxide layer, and forming the nitride layer over the TEOS layer.

13. The device of claim 11, further comprising a micro lens configured to project light toward at least a portion of the semiconductor substrate, and wherein the nitride layer is configured to reflect a portion of the light from the micro lens toward the photodiode region.

* * * * *